(12) United States Patent
Schaeffer, Jr. et al.

(10) Patent No.: US 7,268,574 B2
(45) Date of Patent: Sep. 11, 2007

(54) SYSTEMS AND METHODS FOR SENSING OBSTRUCTIONS ASSOCIATED WITH ELECTRICAL TESTING OF MICROFEATURE WORKPIECES

(75) Inventors: Ralph H. Schaeffer, Jr., Boise, ID (US); Andrew Krivy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 11/217,747

(22) Filed: Sep. 1, 2005

(65) Prior Publication Data

US 2007/0046311 A1    Mar. 1, 2007

(51) Int. Cl.
*G01R 31/26* (2006.01)
(52) U.S. Cl. ............... 324/765; 324/750; 324/754; 324/757
(58) Field of Classification Search ............... None
See application file for complete search history.

(56) References Cited

U.S. PATENT DOCUMENTS

| | | | |
|---|---|---|---|
| 4,864,227 A * | 9/1989 | Sato | 324/758 |
| 4,878,114 A | 10/1989 | Huynh et al. | |
| 4,929,893 A * | 5/1990 | Sato et al. | 324/758 |
| 4,931,962 A | 6/1990 | Palleiko | |
| 5,058,178 A | 10/1991 | Ray | |
| 5,064,291 A | 11/1991 | Reiser | |
| 5,103,095 A | 4/1992 | Elings et al. | |
| 5,245,863 A | 9/1993 | Kajimura et al. | |
| 5,333,495 A | 8/1994 | Yamaguchi et al. | |
| 5,581,082 A | 12/1996 | Hansma et al. | |
| 5,864,054 A | 1/1999 | Smith, Jr. | |

(Continued)

FOREIGN PATENT DOCUMENTS

EP    0 898 300 A2    2/1999

(Continued)

OTHER PUBLICATIONS

Olympus Systems, Inc., "Electroglas Spares," 1 page, retrieved from the Internet on Aug. 9, 2005, <http://www.proberspares.com/index.html>.

(Continued)

*Primary Examiner*—Minh N. Tang
(74) *Attorney, Agent, or Firm*—Perkins Coie LLP

(57) ABSTRACT

Systems and methods for sensing obstructions associated with electrical testing of microfeature workpieces are disclosed. An apparatus in accordance with one embodiment includes a first support member configured to releasably carry a microfeature workpiece, a second support member positioned proximate to the first support member and configured to carry an electrical testing device, wherein at least one of the first and second support members is movable toward and away from the other. The apparatus can further include a signal source (e.g., radiation source) positioned proximate to the support member, and a signal sensor (e.g., a radiation sensor) positioned at least proximate to the first support member and the signal source. The signal sensor can be configured to received at least a portion of the signal directed by the signal source and passing proximate to the first support member. Accordingly, the signal source and signal sensor can be used to detect obstructions carried by the first support member and/or the microfeature workpiece.

54 Claims, 8 Drawing Sheets

U.S. PATENT DOCUMENTS

| | | | |
|---|---|---|---|
| 5,955,661 | A | 9/1999 | Samsavar et al. |
| 6,111,419 | A * | 8/2000 | Lefever et al. ............. 324/754 |
| 6,241,456 | B1 | 6/2001 | Kato et al. |
| 6,267,005 | B1 | 7/2001 | Samsavar et al. |
| 6,388,457 | B1 * | 5/2002 | Loh et al. ................... 324/755 |
| 6,389,885 | B1 | 5/2002 | Arnold et al. |
| 6,480,286 | B1 | 11/2002 | Kubo et al. |
| 6,779,386 | B2 | 8/2004 | Neo et al. |
| 6,812,045 | B1 | 11/2004 | Nikoonahad et al. |
| 6,923,045 | B2 | 8/2005 | Neo et al. |
| 7,057,408 | B2 * | 6/2006 | Schneidewind et al. .... 324/757 |
| 7,126,145 | B2 * | 10/2006 | Ueda ..................... 250/559.29 |
| 2005/0229684 | A1 | 10/2005 | Neo et al. |

FOREIGN PATENT DOCUMENTS

| | | |
|---|---|---|
| JP | 03-030352 | 2/1991 |
| JP | 04-092444 | 3/1992 |
| JP | 09-281016 | 10/1997 |

OTHER PUBLICATIONS

Olympus Systems, Inc., "Electroglas Wafer Probers," 1 page, retrieved from the Internet on Aug. 9, 2005, <http://www.proberspares.com/probers.html>.

Accretech—Tokyo Seimitsu Co. Ltd., "Wafer Probing Machines," 4 pages, retrieved from the Internet on Aug. 9, 2005, <http://www.accretech.jp/products-en/semicon/wafer_pm>.

Mitsubishi Materials Corporation, "Surface Roughness," 2 pages, 2000, retrieved from the Internet on Jul. 4, 2001, <http://www.mitsubishicarbide.com/english/reference/hyoumenarasa.htm>.

* cited by examiner

US 7,268,574 B2

SYSTEMS AND METHODS FOR SENSING OBSTRUCTIONS ASSOCIATED WITH ELECTRICAL TESTING OF MICROFEATURE WORKPIECES

TECHNICAL FIELD

The present invention is directed generally to systems and methods for sensing obstructions associated with electrical testing of microfeature workpieces, including systems and methods for protecting electrical testing devices from damage resulting from such obstructions.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads that are electrically coupled to the functional features. The bond pads are coupled to pins or other types of terminals that extend outside the protective covering for connecting the dies to buses, circuits, and/or microelectronic assemblies. Alternatively, bare microelectronic dies can be connected to other microelectronic assemblies.

Multiple dies are typically formed simultaneously on a single microfeature workpiece (e.g., a wafer), and are electrically tested at the wafer level prior to being singulated and packaged. Probe devices are typically used to perform the electrical test. Existing probe devices can include a chuck that supports the wafer, and a probe card positioned above the chuck and the wafer. The probe card includes a large number of downwardly extending pins that make physical and electrical contact with bond pads on each die when the chuck moves in an upward direction. Once electrical contact is established between the probe card and the wafer-level dies, each die is electrically tested. The dies are then singulated, and acceptable dies are packaged while defective dies are discarded or reworked.

One difficulty with existing probe devices is that not all wafers necessarily have the same thickness. Accordingly, it may be difficult to determine how far to move the wafer in an upward direction so as to make electrical contact with the pins, without crushing the pins. One approach to solving this problem has been to use pneumatic proximity sensors to sample the upper surface of the chuck (e.g., at five to seven locations) and determine the location of the chuck upper surface based on the average of the sampled values. Then a wafer is placed on the chuck, drawn tightly against the chuck with vacuum, and the same sensors are used to determine the position of the wafer upper surface. The thickness of the wafer can be determined based on the difference between the location of the wafer upper surface and the chuck upper surface. This value can then be used to determine how far to move the wafer in an upward direction (relative to a known position of the chuck) in order to make contact with the pins. Suitable devices for electrically testing the wafer and determining the wafer thicknesses are available from Accretech USA, Inc. of Bloomfield Hills, Mich. (model numbers APM90, UF200 and UF3000) and Olympic Systems, Inc. of Rocklin, Calif. (Electroglas model 4090).

While the foregoing approach has been suitable for determining the position to which the wafer is elevated during testing, this technique has nevertheless resulted in pins being crushed. Once a pin is crushed, the entire card is generally rendered inoperative and must be discarded. Because the card may include over 10,000 pins, along with associated test circuitry, the cards are typically high-value items and therefore the loss of a card can significantly increase the cost of producing microelectronic die packages.

DETAILED DESCRIPTION

Figure 1:
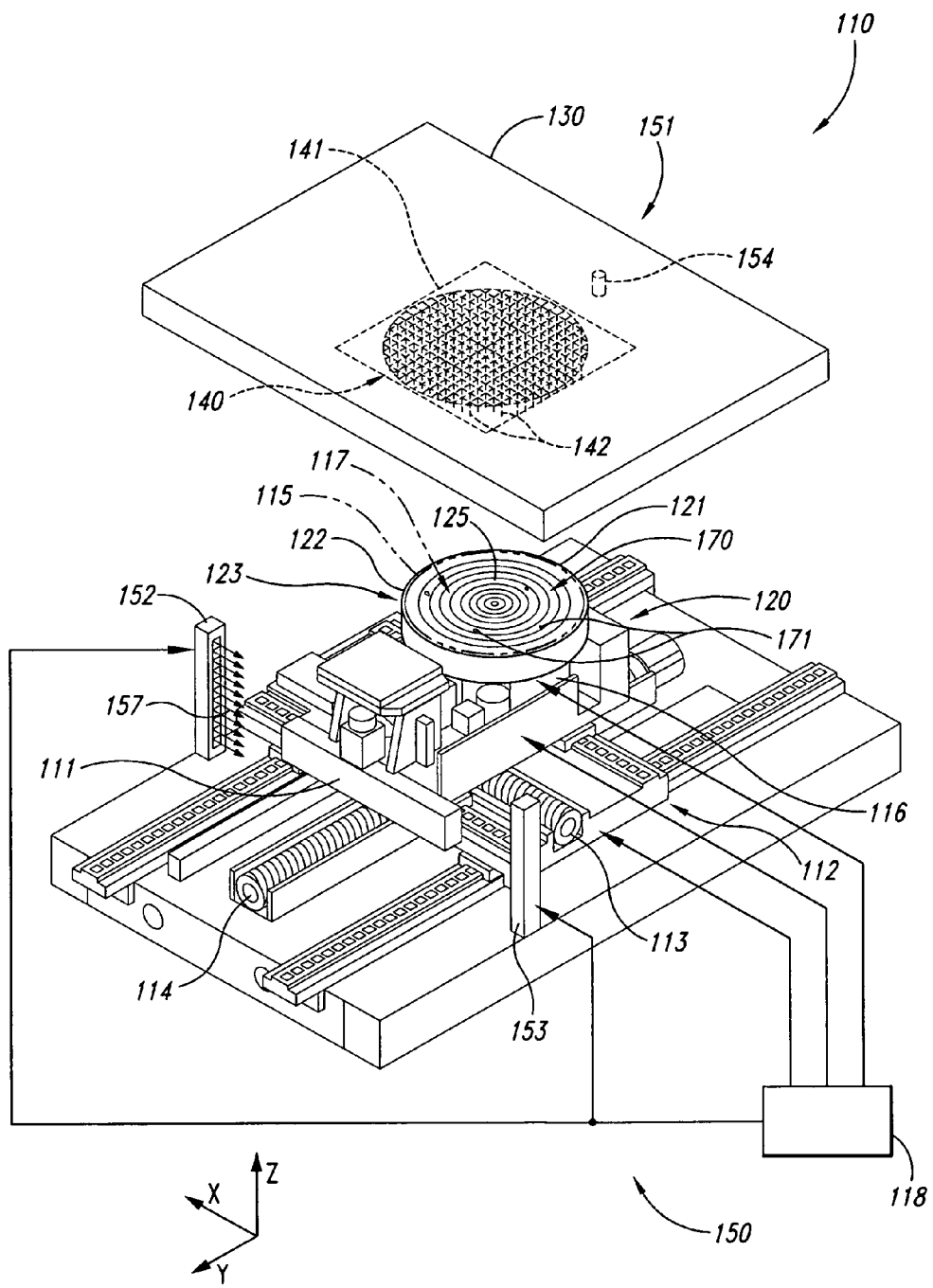
FIG. 1 is a partially schematic, isometric illustration of an apparatus configured to sense obstructions that may interfere with testing microfeature workpieces.

One drawback associated with existing devices used for electrically testing microfeature workpieces is that extraneous particles can become trapped between the workpiece and the chuck that supports the workpiece during testing. When a vacuum is applied to the workpiece to draw the workpiece down against the chuck, the workpiece may flex and form high spots over the trapped particles. High spots may also (or alternatively) be formed by particles on the upper surface of the workpiece. When the workpiece is moved upwardly into contact with the probe card, the high spots can crush the probe card pins, rendering the probe card inoperable.

An apparatus for testing microfeature workpieces in accordance with an aspect of the invention includes a first support member configured to releasably carry a microfeature workpiece. The apparatus can further include a second support member positioned proximate to the first support member, with the second support member being configured to carry an electrical testing device for microfeature workpieces. At least one of the first and second support members can be movable toward and away from the other. The apparatus can further include a signal source (e.g., a radiation source) positioned proximate to the first support member, and a signal sensor (e.g., a radiation sensor) positioned at least proximate to the first support member and the signal source. The signal sensor can be configured to receive at least a portion of the signal directed by the signal source and passing proximate to the support member.

In particular embodiments, the signal source can include a radiation source and the signal sensor can include a radiation sensor positioned to detect at least one of (a) radiation from the radiation source, and (b) an absence of radiation from the radiation source due to a structure (e.g., an obstruction) between the radiation source and the radiation sensor. The radiation source can be positioned to direct a radiation beam over a strip-wise region of the microfeature workpiece, and the first support member can be configured to move the microfeature workpiece in two transverse directions, for example, to scan the workpiece relative to the radiation beam.

Other aspects of the invention are directed toward methods for assessing a microfeature workpiece. One such method includes carrying a microfeature workpiece with a support surface so that the microfeature workpiece is proximate to an electrical testing device. The method can further include determining if a profile of at least one of the support surface and a surface of the microfeature workpiece exceeds a threshold value. If the threshold value is not exceeded, the method can further include engaging the electrical testing device with the microfeature workpiece.

In further specific aspects of the invention, the method can further include determining an average location of the support surface by averaging data taken at several locations of the support surface. An average location of the surface of the microfeature workpiece can be determined by averaging data taken at several locations of the surface of the microfeature workpiece. The method can further include determining if a profile of the support surface exceeds a threshold deviation from the average location of the support surface by directing radiation across the support surface in a direction generally parallel to the support surface, and sensing the radiation after the radiation has passed over the support surface. The method can still further include determining if a profile of the microfeature workpiece exceeds a threshold value by directing radiation across the microfeature workpiece in a direction generally parallel to the support surface, and sensing the radiation after the radiation has passed over the microfeature workpiece.

As used herein, the terms "microfeature workpiece" and "workpiece" refer to substrates on and/or in which microelectronic devices are integrally formed. Typical microelectronic devices include microelectronic circuits or components, thin-film recording heads, data storage elements, microfluidic devices and other products. Micromachines and micromechanical devices are included within this definition because they are manufactured using much of the same technology that is used in the fabrication of integrated circuits. The substrates can be semiconductive pieces (e.g.; doped silicon wafers or gallium arsenide wafers), nonconductive pieces (e.g., various ceramic substrates) or conductive pieces. In some cases, the workpieces are generally round, and in other cases the workpieces have other shapes, including rectilinear shapes. Several embodiments of systems and methods for detecting obstructions in connection with microfeature workpiece testing are described below. A person skilled in the relevant art will understand, however, that the invention may have additional embodiments, and that the invention may be practiced without several of the details of the embodiments described below with reference to FIGS. 1-9.

FIG. 1 is a partially schematic, top isometric view of an apparatus 110 configured to perform electrical tests on a microfeature workpiece 115 (shown in phantom lines) in accordance with an embodiment of the invention. The apparatus 110 can include a first support member 120 that carries the upwardly facing microfeature workpiece 115, and a second support member 130 that carries a downwardly facing electrical testing device 140. The electrical testing device 140 can include a card 141 (e.g., a probe card) having pins 142 that contact the microfeature workpiece 115 when the microfeature workpiece 115 is positioned beneath the card 141 and then elevated. A detection system 150 is located to sense obstructions that might interfere with the pins 142 when engaging the microfeature workpiece 115 with the pins 142. Accordingly, the apparatus 110 can reduce or eliminate the likelihood for damage to the pins 142 by sensing potentially harmful obstructions before the microfeature workpiece 115 is engaged with the pins 142. Further details of the detection system 150 and associated structures and functions of the apparatus 110 are described below.

The first support member 120 can include a chuck 121 that has a support surface 122 for engaging the microfeature workpiece 115. The support surface 122 can include vacuum grooves 125 that are coupled to a vacuum system for drawing the microfeature workpiece 115 tightly down against the support surface 122. Accordingly, the microfeature workpiece 115 can be supported by the chuck 121 at a workpiece location 123. The first support member 120 can be carried by an X-axis carriage 111 that moves back and forth along the X-axis via a powered X-axis lead screw 113. The X-axis carriage 111 can be carried by a Y-axis carriage 112 that moves the chuck 121 along the Y-axis via a Y-axis lead screw 114. The chuck 121 can be elevated or retracted in the Z direction via a Z-axis motor 116. Accordingly, the chuck 121 can be aligned with the card 141 and elevated to contact the microfeature workpiece 115 with the card 141.

Before the microfeature workpiece 115 is elevated into contact with the electrical testing device 140, the detection system 150 can be used to determine whether or not obstructions 170 (e.g., one or more particles 171) may cause the microfeature workpiece 115 to bend the pins 142 as a result of contact between these components. The obstructions 170 can include any of a variety of contaminants that may result from prior processing steps. The dimensions of the particles 171 shown in the Figures are exaggerated for purposes of illustration. The detection system 150 can include a thickness detector 151 for determining a thickness of the microfeature workpiece 115. The detection system 150 can also include a signal source (e.g., a radiation source 152) that emits a signal (e.g., a radiation beam 157), and a signal sensor (e.g., a radiation sensor 153) for determining the presence of obstructions. In other embodiments, the signal source and signal sensor can include other devices. The thickness detector 151, radiation source 152, and radiation sensor 153 are each described in turn below.

The thickness detector 151 can include a pneumatic proximity probe 154 that extends very close to the support surface 122 (when the chuck 121 is elevated) to determine the location of the support surface 122 before the microfeature workpiece 115 is placed on the support surface 122. The proximity probe 154 and/or the microfeature workpiece 115 can be moved relative to each other to obtain a sampling of location data. The thickness detector 151 can average the data obtained from the proximity probe 154 to determine a general or average location of the support surface 122 along the Z-axis. After the microfeature workpiece 115 is placed on the support surface 122, the same pneumatic proximity probe 154 and associated procedure can be used to determine the general or average location of an upwardly facing surface 117 of the microfeature workpiece 115. By determining the difference between the location of the support surface 122 and the location of the upwardly facing surface 117, the thickness detector 151 can be used to determine the thickness of the microfeature workpiece 115. The microfeature workpiece thickness can then be used to determine the amount by which the chuck 121 should be elevated to contact the microfeature workpiece 115 with the electrical testing device 140. A controller, 118 (e.g., a programmable processor) controls the motion of the chuck 121 and the operation of the detection system 150.

Figure 2A:
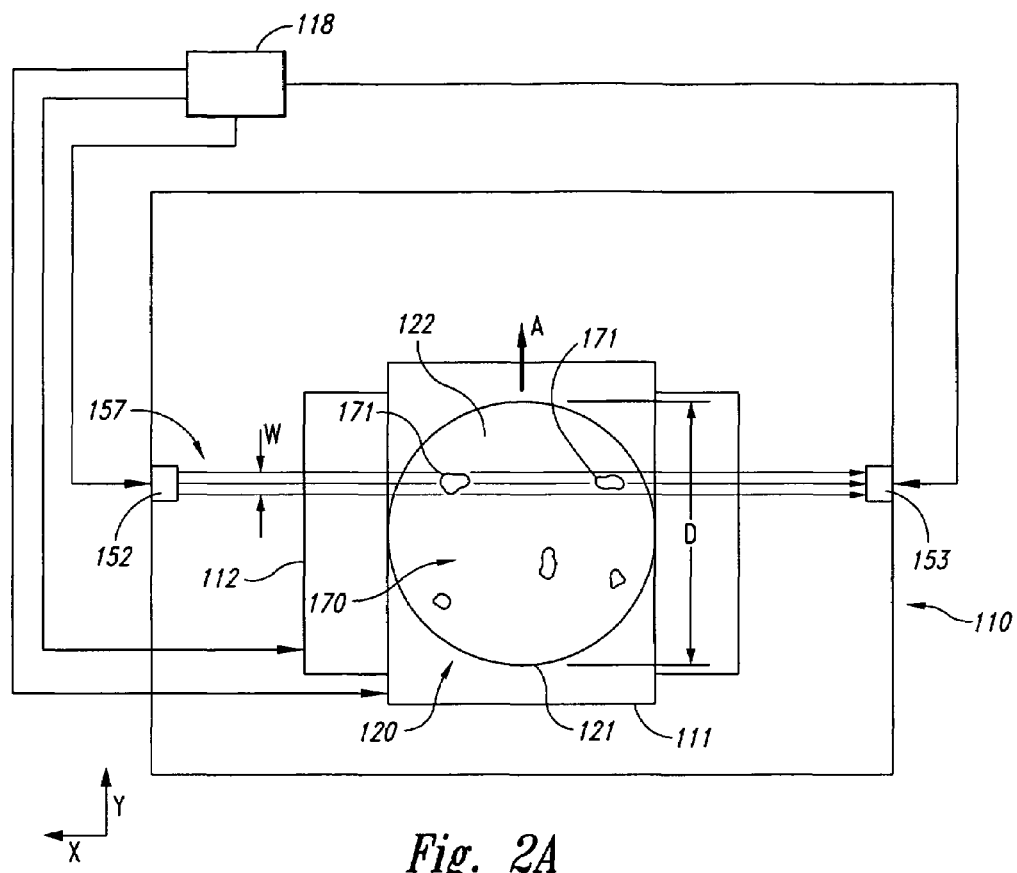
FIGS. 2A and 2B are schematic top plan and side elevational views, respectively, of an embodiment of the apparatus shown in FIG. 1.
Figure 2B:
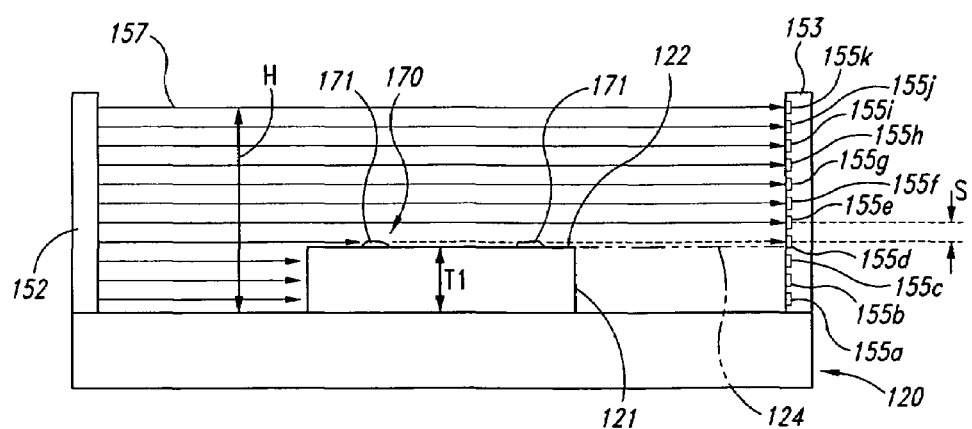

Before the microfeature workpiece 115 is contacted with the electrical testing device 140, the radiation source 152 can be activated to check for obstructions. The operation of the radiation source 152 and the radiation sensor 153 are described in greater detail with reference to FIG. 2A (a schematic top plan view of an embodiment of the apparatus 110 described above with reference to FIG. 1), and FIG. 2B (a schematic side elevational view of the same apparatus 110). Referring now to FIGS. 2A and 2B together, the radiation source 152 can emit a radiation beam 157 that travels along a radiation path toward the radiation sensor 153. The radiation sensor 153 can detect at least a portion of the radiation beam 157. The radiation sensor 153 can also detect the absence or diminution of radiation caused by obstructions 170 (e.g., particles 171) on the support surface 122 of the first support member 120.

In a particular embodiment, the radiation sensor 153 can include multiple sensor elements 155, individually identified as sensor elements 155a-155k in FIG. 2B. The sensor elements 155 can be separated by a distance S that is no greater than minimum permissible height of an obstruction 170. The radiation source 152 can have an aperture sized to emit a radiation beam 157 having a width W that is less than a diameter D of the chuck 121, and a height H that is greater than a thickness T1 of the chuck 121. As the chuck 121 scans through the radiation beam 157 (as indicated by arrow A in FIG. 2A), the radiation beam 157 passes over successive strip-shaped local regions of the support surface 122 of the chuck 121. Sensor elements 155a-155c will not receive radiation because the radiation will be blocked by the chuck 121. If there are no obstructions on the support surface 122, then sensor element 155d will receive radiation (as indicated by dashed lines in FIG. 2B) and radiation sensors 155e-155k will also receive radiation.

When an obstruction 170 (e.g., a particle 171) passes through the radiation beam 157, at least one additional sensor element 155 may be prevented from receiving radiation. For example, as shown in FIG. 2B, the particles 171 extend above the support surface 122 by distance sufficient to block radiation that would otherwise impinge on sensor element 155d. In other embodiments, the particles 171 may extend further above the support surface 122 and may accordingly block additional sensor elements 155. In any of these embodiments, the amount of radiation detected by the radiation sensor 153 changes (e.g., decreases) as the obstructions 170 pass through the radiation beam 157. This change can be signaled to a user, for example, with a visual or aural signal provided by the controller 118. The controller 118 can also be programmed to automatically halt the motion of the chuck 121 when an obstruction 170 is detected. The user can then clean or otherwise treat the support surface 122 to remove the obstructions 170.

After the cleaning operation, the scanning motion of the chuck 121 can be continued until the chuck 121 is completely scanned. In another embodiment, the process of scanning the chuck 121 can be re-initiated and the entire chuck 121 can be re-scanned, for example, to identify any new or re-positioned obstructions 170 that may be located on an area of the chuck 121 that had previously been scanned. Once the chuck 121 has been determined to be free from potentially damaging obstructions 170, the process can continue with assessing a microfeature workpiece placed on the chuck 121, as described below with reference to FIGS. 3A-3B.

Figure 3A:
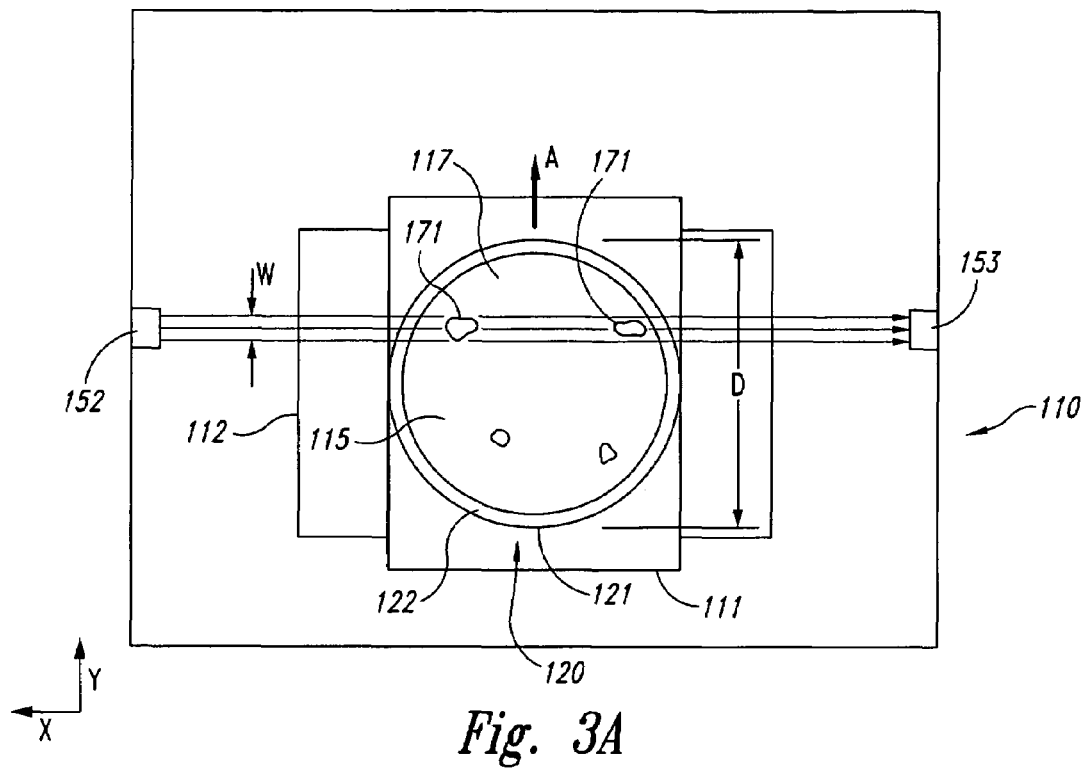
FIGS. 3A and 3B are schematic top plan and side elevation views, respectively, of the apparatus shown in FIGS. 2A and 2B, shown supporting a microfeature workpiece.
Figure 3B:
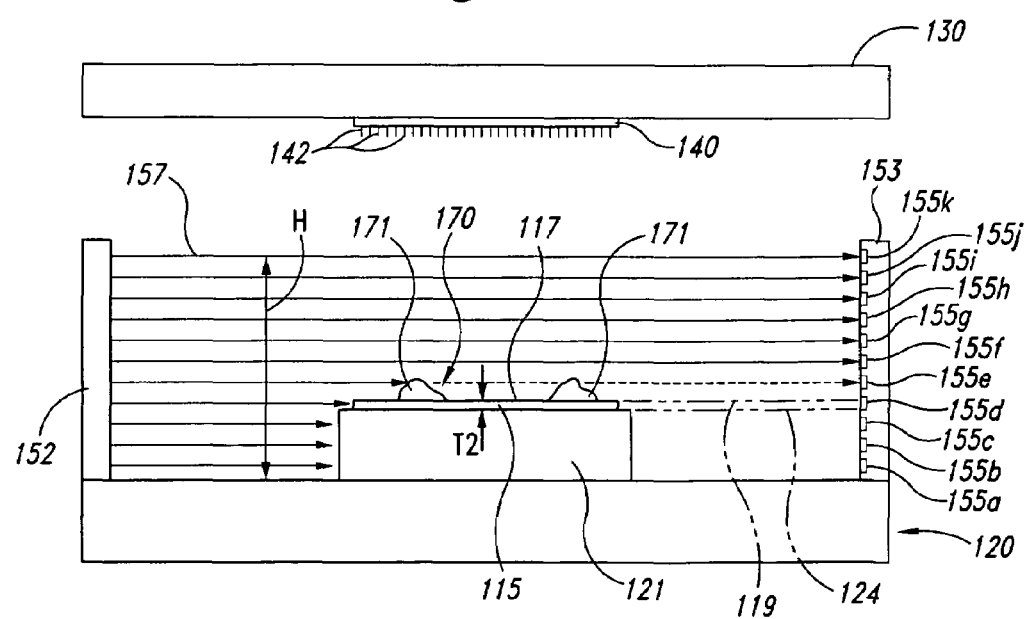
Figure 4A:
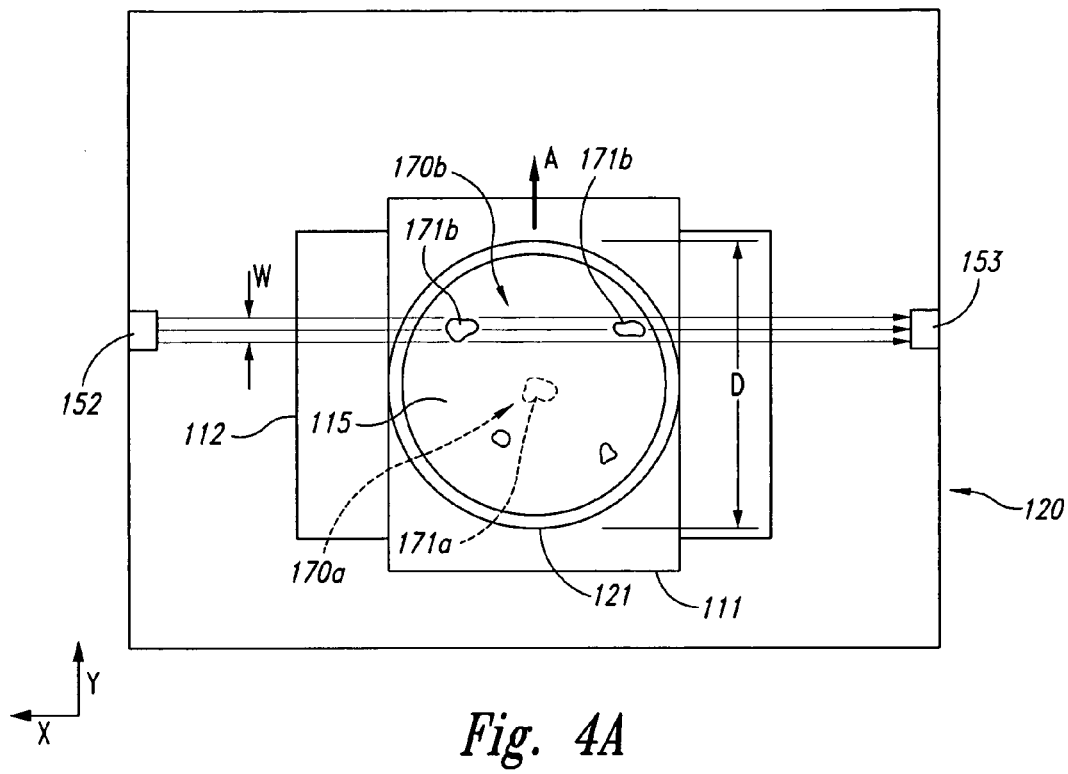
FIGS. 4A-4B are schematic top plan and side elevation views, respectively, of the apparatus shown in FIGS. 2A and 2B positioned to sense obstructions associated with a chuck and microfeature workpiece together, in accordance with another embodiment of the invention.
Figure 4B:
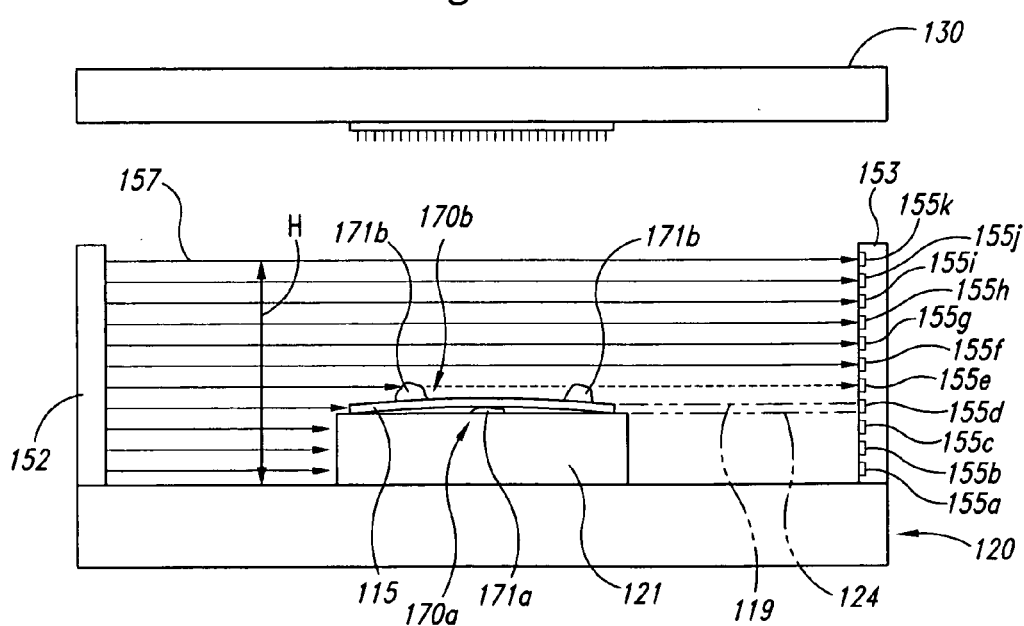

FIG. 3A is a schematic top plan view of the apparatus 110 with a microfeature workpiece 115 placed on the chuck 121. FIG. 3B is a schematic, side elevation view of the apparatus 110 shown in FIG. 3A. Referring to FIGS. 3A and 3B together, the chuck 121 has been cleaned so that it no longer includes obstructions 170 on the support surface 122. Accordingly, the support surface 122 forms a generally flat support surface plane 124, which was located by the thickness detector 151. The microfeature workpiece 115 has a thickness T2 and the upwardly facing surface 117 of the microfeature workpiece 115 forms a generally flat workpiece surface plane 119, which was also located by the thickness detector 151. However, the upwardly facing surface 117 can include obstructions 170 (e.g., particles 171) that project above the workpiece surface plane 119. The presence of the obstructions 170 can be detected by the sensor elements 155 in a manner generally similar to that described above with reference to FIGS. 2A and 2B. In a particular aspect of an embodiment shown in FIG. 3B, sensor element 155e would, in the absence of the obstructions 170, detect radiation from the radiation source 152. However, due to the obstructions 170, sensor element 155e does not receive radiation from the radiation source 152 and this absence of radiation can be used to identify the presence of the obstructions 170. The obstructions 170 can accordingly be removed prior to testing the microfeature workpiece 115.

One feature of an embodiment of the apparatus 110 and associated method described above is that they can be used to detect obstructions 170 on the chuck 121 and/or the microfeature workpiece 115. Once such obstructions are detected, the appropriate surfaces (e.g., the support surface 122 or the workpiece surface 117) can be cleaned or otherwise treated to remove the obstructions. After the obstructions 170 have been removed, electrical testing can continue by engaging the microfeature workpiece 115 with the electrical testing device 140. The detection system 150 can detect obstructions 170 over all, or approximately all of the relevant surfaces. For example, the detection system 150 can detect obstructions 170 over at least the amount of the microfeature workpiece surface 117 that is to be engaged by the electrical testing device 140, and at least the amount of the chuck support surface 122 that is to be engaged with the microfeature workpiece 115.

An advantage of at least some embodiments of systems and methods having the foregoing features is that they can reduce or eliminate the tendency for obstructions 170 on the chuck 121 and/or the microfeature workpiece 115 to interfere with the pins 142 of the electrical testing device 140. Accordingly, the likelihood for bending the pins 142 can be significantly reduced or eliminated. Because the electrical testing device 140 can have a substantial number of pins 142 (e.g., more than 10,000) and associated testing circuitry, it tends to be a high value item. By reducing the likelihood for damage to this item, the overall cost of producing microfeature dies (including testing the microfeature workpiece 115) can be reduced. This in turn can reduce the cost of finished electronic products that include the microfeature dies.

Another feature of at least some of the systems and methods described above is that they can accommodate a variety of chucks 121 and microfeature workpieces 115. For example, the radiation source 152 and radiation sensor 153 (including the sensor elements 155) can extend upwardly by a distance that is sufficient to accommodate a variety of chuck thicknesses T1 and workpiece thicknesses T2. An advantage of this feature is that it increases the versatility of the apparatus 110.

In an embodiment described above with reference to FIGS. 2A-3B, the chuck 121 and the microfeature workpiece 115 were individually assessed for obstructions 170. In another embodiment shown in FIGS. 4A and 4B, this assessment can be completed on the chuck 121 and the microfeature workpiece 115 together. For example, the chuck 121 may include a first obstruction 170a (e.g., a first particle 171a) and the microfeature workpiece 115 may include one or more second obstructions 170b (e.g., second particles 171b). The radiation source 152 and radiation sensor 153 can be used to determine that the obstructions 170a, 170b alone or together cause a deviation in the surface profile of microfeature workpiece 115 that may damage the associated electrical testing device 140 (not shown in FIG. 4B). Once this assessment is made, the user can remove the microfeature workpiece 115 and clean both the chuck 121 and the microfeature workpiece 115 before reassessing the workpiece/chuck combination. In another embodiment, the user can remove and clean the microfeature workpiece 115, then replace the microfeature workpiece 115 on the chuck 121 and reassess the combination. If the combination is still out of tolerance (e.g., due to a particle trapped between the chuck 121 and the microfeature workpiece 115), the user can re-remove the microfeature workpiece 115 and clean the chuck 121 before reassessing the workpiece/chuck combination. In either embodiment, the radiation source 152 and the radiation sensor 153 can be used to detect a noncompliant obstruction and signal its presence to the user who can take the appropriate action.

Figure 5:
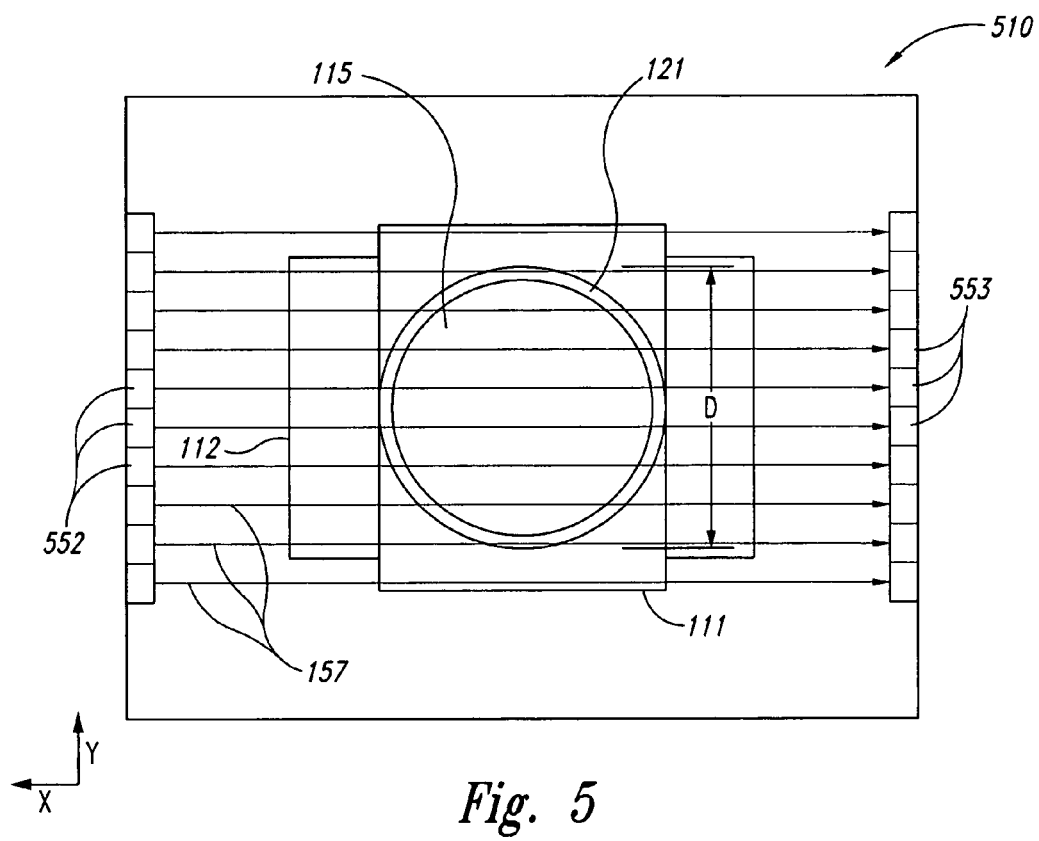
FIG. 5 is a top plan view of an apparatus having multiple radiation sources and corresponding sensors in accordance with another embodiment of the invention.

FIG. 5 is a partially schematic plan view of an apparatus 510 that includes multiple radiation sources 552 and corresponding multiple radiation sensors 553 located on opposite sides of the chuck 121 and the microfeature workpiece 115 carried by the chuck 121. In one aspect of this embodiment, the composite of radiation beams 157 emitted by the radiation sources 552 can extend over the entire diameter D of the chuck 121 (or at least that portion of the chuck 121 directly beneath the microfeature workpiece 115). Accordingly, the chuck 121 need not be scanned relative to the radiation sources 552. Instead, the entire chuck 121 (and, in a separate step or simultaneously, the microfeature workpiece 115) can be assessed. This feature can reduce the time required to assess the chuck 121 and the microfeature workpiece 115.

In at least some embodiments described above, the radiation sensors include sensor elements that have two states: a first state if radiation is received, and a second state if radiation is not received. In other embodiments, the sensor elements can be more sensitive and can detect gradations of radiation. This arrangement can be particularly suitable when the obstructions detected by the sensor elements are not opaque to the radiation, but instead are at least partially transmissive to the radiation and therefore reduce radiation intensity at a particular location without completely blocking the radiation. Accordingly, any of the sensor elements described above can include such a feature. The sensor elements can also be selected to detect the particular radiation emitted by the radiation source, rather than a wide range of radiations. The radiation source can emit radiation at wavelengths in the visible range, or outside the visible range. The radiation is generally collimated or otherwise directed in a uniform manner, and in at least some embodiments, can include laser radiation.

Figure 6:
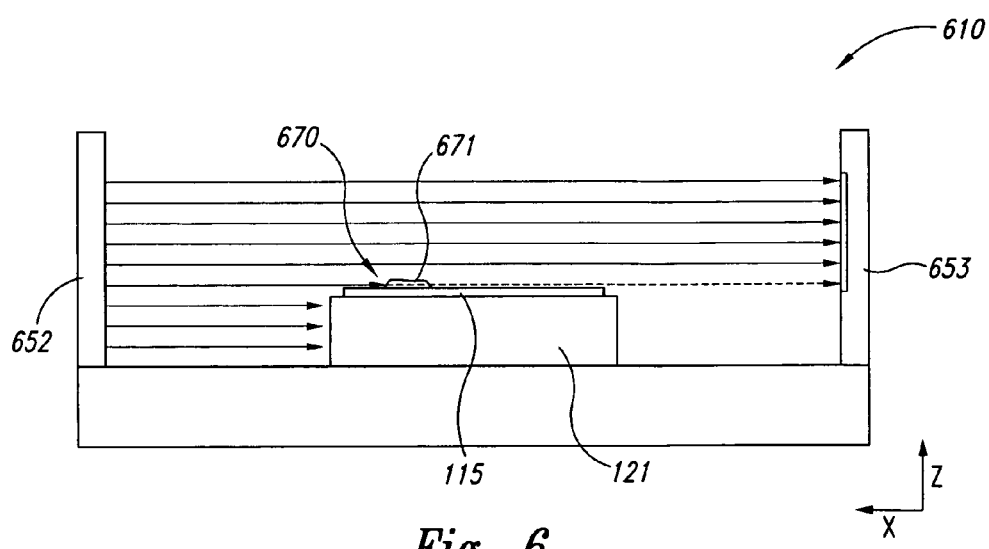
FIG. 6 is a partially schematic, side elevation view of an apparatus having a sensor configured to detect a change in detected radiation intensity, in accordance with an embodiment of the invention.

In at least one embodiment shown schematically in FIG. 6, an apparatus 610 can include a radiation source 652 positioned across the chuck 121 from a radiation sensor 653. The radiation sensor 653 can include a single sensor element 655 that is sensitive enough to detect a reduction in received radiation caused by an opaque or translucent obstruction 670 (e.g., a particle 671). The single sensor element 655 can accordingly extend in the Z direction over a distance great enough to accommodate microfeature workpieces having a variety of thicknesses, and obstructions 670 having a variety of elevations above the surface of either the chuck 121 or the microfeature workpiece 115. An advantage of this arrangement is that the single radiation sensor element 655 may be simpler to employ than multiple radiation sensing elements described above.

Figure 7:
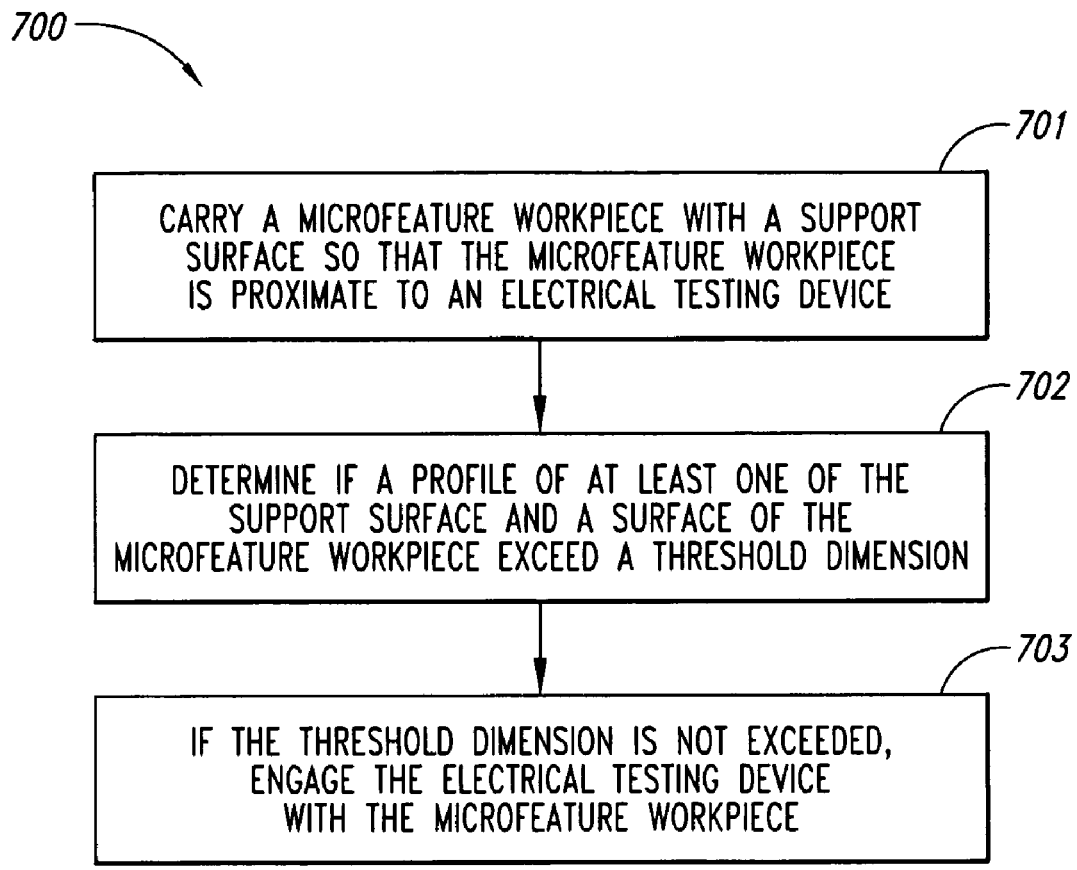
FIGS. 7-9 illustrate flow diagrams corresponding to methods in accordance with further embodiments of the invention.
Figure 8:
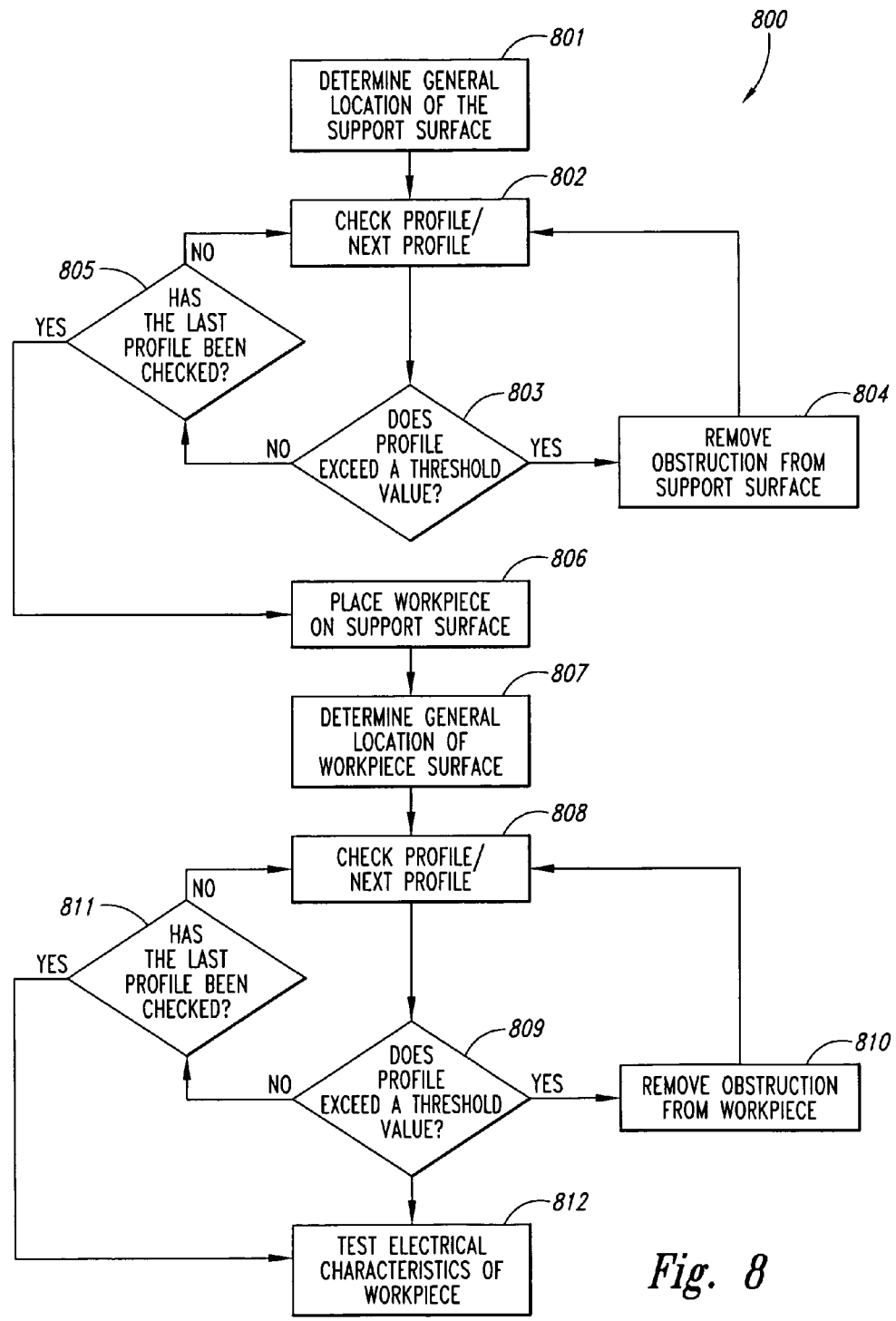
Figure 9:
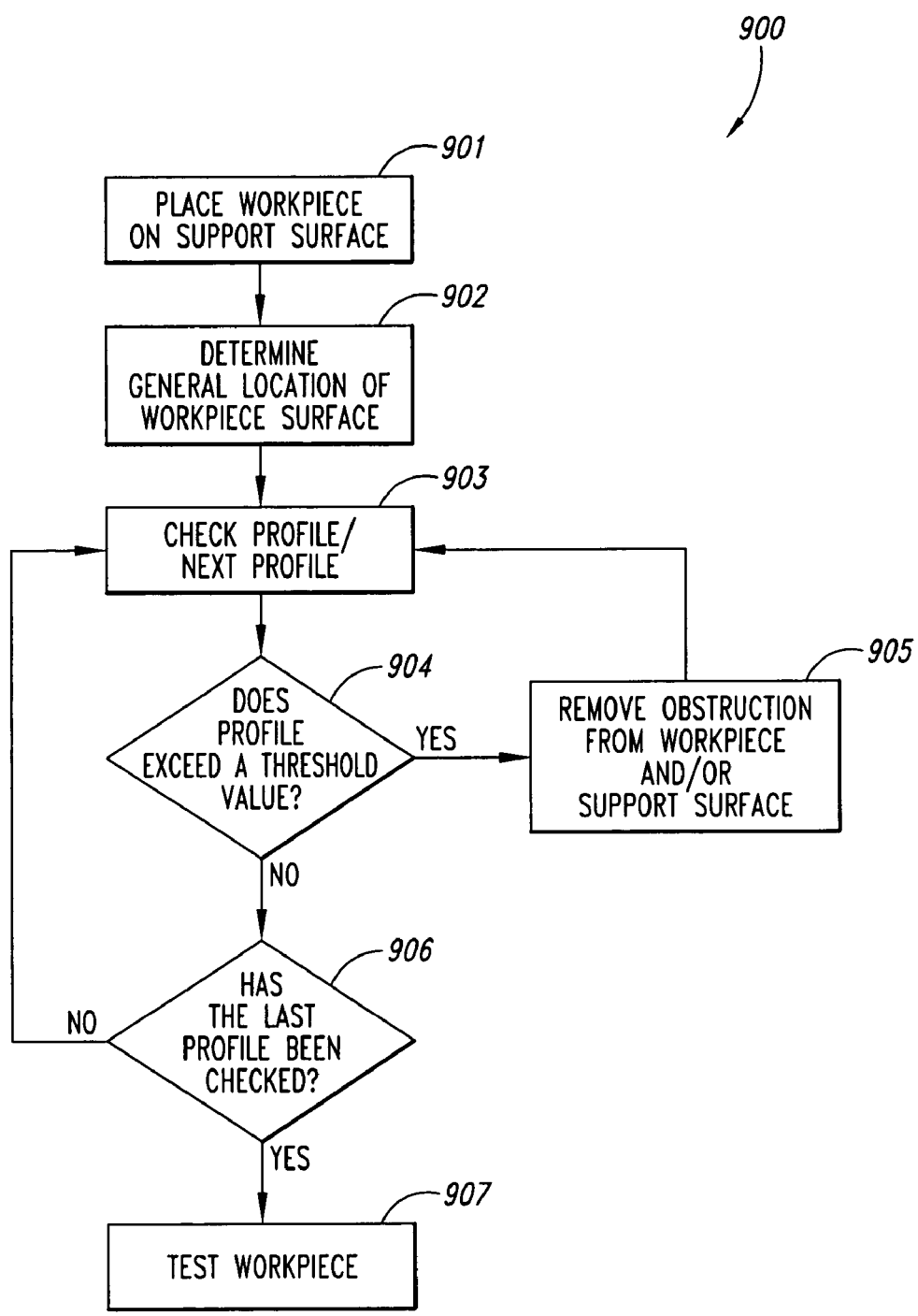

FIGS. 7-9 are flow diagrams illustrating methods for assessing microfeature workpieces in accordance with several embodiments of the invention. Beginning with FIG. 7, a process 700 can include carrying a microfeature workpiece with a support surface so that the microfeature workpiece is proximate to an electrical testing device (process portion 701). The process can further include determining if a profile of at least one of the support surface and a surface of the microfeature workpiece exceeds a threshold dimension (process portion 702). For example, process portion 702 can include determining whether the presence of an obstruction is sufficient to potentially cause damage to an electrical testing device that will be engaged with the microfeature workpiece. In process portion 703, the method can include engaging the electrical testing device with the microfeature workpiece if the threshold dimension is not exceeded.

FIG. 8 is a flow diagram illustrating a process 800 for assessing a microfeature workpiece and a testing device on which the microfeature workpiece is positioned. In process portion 801, the process 800 can include determining a general location of a support surface on which the microfeature workpiece is to be positioned. For example, process portion 801 can include obtaining the locations of several points on the support surface and averaging the location information. In process portion 802, the process can include checking an initial (or next) profile corresponding to a region of the support surface (e.g., a strip-wise region). For example, process portion 802 can include directing radiation over the support surface and detecting the presence or absence of obstructions. The obstructions can form a profile that projects in a generally normal direction from a major surface of the microfeature workpiece. Process portion 803 includes determining whether the local profile or an aspect of the profile exceeds a threshold value. For example, process portion 803 can include determining whether an obstruction extends beyond the general location of the support surface by more than a threshold amount. If it does, then in process portion 804, the obstruction can be removed from the support surface. After the obstruction is removed, the process can include continuing to scan the remaining portion of the support surface or rescanning the entire support surface (process portion 802). If there is no obstruction, or if there is an obstruction but it does not exceed a threshold deviation from the general or average value, then process portion 805 includes determining if the last profile has been checked (indicating that the evaluation of the support surface is complete). If the last profile has not been checked, the process returns to process portion 802. If the last profile has been checked, then the process continues with process portion 806.

In process portion 806, the workpiece is placed on the support surface. In process portion 807, the general location of a workpiece surface that is to be tested is determined. The general location can be determined via a method at least generally similar to that described above with reference to process portion 801. In process portion 808, the initial profile or next profile of the workpiece is checked, for example, using the radiation source and radiation sensor previously used to assess the support surface. Process portion 809 includes determining whether the profile or an aspect of the profile exceeds a target value. If it does, then the obstruction is removed from the workpiece (process portion 810). The remaining portion of the workpiece, or the entirety of the workpiece can then be rechecked by returning to process portion 808. If the profile does not exceed the target value, then process portion 811 includes determining if the last profile has been checked. If it has not, then the process returns to process portion 808. If it has, then the electrical characteristics of the workpiece are tested (process portion 812).

FIG. 9 is a flow diagram illustrating a process 900 that includes assessing both the microfeature workpiece and the support surface carrying the microfeature workpiece together. In process portion 901, the process can include placing the workpiece on the support surface, and in process portion 902, the process can include determining a general location of a surface of the workpiece (e.g., determining the average location of an upwardly facing surface of the workpiece using a sampling thickness detector, as described above with reference to FIGS. 2A-2B). In process portion 903, an initial (or next) profile is checked. Process portion 904 includes determining whether the profile or a portion of the profile exceeds a threshold value. If it does, this indicates the presence of an obstruction which can be removed in process portion 905. The process 900 then returns to process portion 903 to continue checking profiles, or re-check all profiles. If the profile does not exceed the target value, then process portion 906 includes determining whether the last profile has been checked. If it has, then the workpiece is tested in process portion 907, and if it has not, then the process 900 returns to process portion 903.

The process for removing obstructions from the workpiece and/or the support surface (process portion 905) can be conducted in one of several ways, as described above with reference to FIGS. 4A-4B. For example, in one embodiment, the obstruction can initially be assumed to be on the microfeature workpiece and, accordingly, only the microfeature workpiece can be cleaned in process portion 905. Process portions 903-905 can be re-performed on the workpiece/support surface combination to determine if cleaning the workpiece alone was sufficient to remove the obstruction. If an obstruction is detected again, then the support surface can also be cleaned. Alternatively, when an obstruction is detected, both the workpiece and the support surface can be cleaned.

Many of the process portions described above with reference to FIGS. 7-9 can be carried out automatically by the controller 118 described above with reference to FIG. 1. Accordingly, the controller 118 can include a computer-readable medium that automatically directs the motion of the chuck and the workpiece (including halting such motion), the operation of the detection device, the computations performed on data received from the detection device, and/or signals to the user identifying the results. These directions may in at least some instances include involvement from a user, e.g. to initiate the operation and/or restart an operation that may have been interrupted due to the detection of an obstruction.

For the foregoing, it will be appreciated that specific embodiments of the invention have been described herein for purposes of illustration, but that various modifications may be made without deviating from the invention. For example, in some embodiments, the detection system can include sources and sensors that emit signals other than radiation signals. Such signals can include sonic signals. In other embodiments, the radiation source (e.g., in coordination with the radiation sensor) can move in addition to or in lieu of moving the microfeature workpiece. Aspects of the invention described in the context of particular embodiments may be combined or eliminated in other embodiments. For example, the sensor element described in the context of FIG. 6 can be used with any of the devices described above with reference to FIGS. 1-5. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

We claim:

1. An apparatus for testing microfeature workpieces, comprising:
   a first support member configured to releasably carry a microfeature workpiece;
   a second support member positioned proximate to the first support member, the second support member being configured to carry an electrical testing device for microfeature workpieces, at least one of the first and second support members being movable toward and away from the other;
   a signal source positioned proximate to the first support member, wherein the signal source is positioned to direct a signal across a planar support surface of the first support member when the first support member does not carry a microfeature workpiece, and wherein the signal source is positioned to direct radiation across a planar surface of a microfeature workpiece when the first support member does carry the microfeature workpiece; and
   a signal sensor positioned at least proximate to the first support member and the signal source, the signal sensor being configured to receive at least a portion of the signal directed by the signal source and passing proximate to the first support member.

2. The apparatus of claim 1 wherein the signal source includes a radiation source and wherein the signal sensor includes a radiation sensor.

3. The apparatus of claim 1 wherein the signal source includes a radiation source and wherein the signal sensor includes a radiation sensor positioned to detect at least one of (a) radiation from the radiation source, and (b) an absence of radiation from the radiation source due to a structure between the radiation source and the radiation sensor.

4. The apparatus of claim 1 wherein the first support member is configured to releasably carry a microfeature workpiece at a workpiece location, and wherein the signal source is positioned to direct radiation across the workpiece location in a direction generally parallel to a plane of the workpiece location.

5. The apparatus of claim 1 wherein the workpiece location is sized to accommodate a microfeature workpiece having a first width, and wherein the signal source includes an aperture positioned to emit a signal beam having a second width less than the first width.

6. The apparatus of claim 1, further comprising the electrical testing device, and wherein the electrical testing device includes a card and a plurality of pins carried by the card, the pins being positioned to make physical and electrical contact with structures on a microfeature workpiece.

7. An apparatus for testing microfeature workpieces, comprising:
a first support member configured to releasably carry a microfeature workpiece;
a second support member positioned proximate to the first support member, the second support member being configured to carry an electrical testing device for microfeature workpieces, at least one of the first and second support members being movable toward and away from the other;
a radiation source positioned proximate to the first support member; and
a radiation sensor having a plurality of sensor elements arranged along an axis extending away from the first support member, wherein the radiation sensor is positioned at least proximate to the first support member and the radiation source, the radiation sensor being configured to receive at least a portion of the radiation directed by the radiation source and passing proximate to the first support member.

8. The apparatus of claim 7 wherein the radiation sensor is positioned to detect at least one of (a) radiation from the radiation source, and (b) an absence of radiation from the radiation source due to a structure between the radiation source and the radiation sensor.

9. The apparatus of claim 7 wherein the first support member is configured to releasably carry a microfeature workpiece at a workpiece location, and wherein the radiation source is positioned to direct radiation across the workpiece location in a direction generally parallel to a plane of the workpiece location.

10. The apparatus of claim 7 wherein the radiation source emits radiation in the visible spectrum.

11. The apparatus of claim 7 wherein the radiation source includes a laser source.

12. The apparatus of claim 7 wherein the radiation sensor includes a plurality of radiation sensors.

13. The apparatus of claim 7 wherein the workpiece location is sized to accommodate a microfeature workpiece having a first width, and wherein the radiation source includes an aperture positioned to emit a radiation beam having a second width less than the first width.

14. The apparatus of claim 7, further comprising the electrical testing device, and wherein the electrical testing device includes a card and a plurality of pins carried by the card, the pins being positioned to make physical and electrical contact with structures on a microfeature workpiece.

15. The apparatus of claim 7 wherein the first support member is positioned to carry the microfeature workpiece in a generally horizontal orientation.

16. The apparatus of claim 7 wherein the first support member includes a support surface having a plurality of vacuum apertures positioned to draw a microfeature workpiece into contact with the support surface.

17. The apparatus of claim 7 wherein the first support member is movable relative to the radiation source and the radiation sensor.

18. The apparatus of claim 7 wherein the first support member is configured to releasably carry a microfeature workpiece at a generally planar workpiece location, and wherein the radiation source is positioned to direct radiation across the workpiece location in a direction generally parallel to a plane of the workpiece location, further wherein the first support member is movable in two transverse directions parallel to the plane of the workpiece location, and one direction generally perpendicular to the plane of the workpiece location toward and away from the second support member.

19. The apparatus of claim 7 wherein the radiation sensor is configured to detect gradations in radiation intensity.

20. The apparatus of claim 7 wherein the radiation source is positioned to direct a radiation beam over a strip-wise region of a microfeature workpiece.

21. The apparatus of claim 7, further comprising a workpiece thickness detector positioned proximate to the first support member, the workpiece thickness detector being configured to:
detect first location values corresponding to a plurality of points on a support surface of the first support member;
detect second location values corresponding to a plurality of points on a surface of a microfeature workpiece carried by the first support member;
determine an average location of the support surface based on the first location values; and
determine an average thickness of a microfeature workpiece carried by the first support member based on a difference between the first and second location values.

22. The apparatus of claim 7 wherein the radiation source is positioned to direct radiation across a planar support surface of the first support member when the first support member does not carry a microfeature workpiece, and wherein the radiation source is positioned to direct radiation across a planar surface of a microfeature workpiece when the first support member does carry the microfeature workpiece.

23. The apparatus of claim 7, further comprising a controller operatively coupled to the radiation source, the radiation sensor and at least one of the first and second support members, the controller including instructions that:
direct the relative motion of at least one of the first support member and the radiation source; and
provide a signal if an obstruction is detected between the radiation source and the radiation sensor.

24. An apparatus for testing microfeature workpieces, comprising:
a first support member configured to releasably carry a microfeature workpiece at a workpiece location;
a second support member positioned proximate to the first support member and carrying an electrical testing device, at least one of the first and second support members being movable toward and away from the other;
a plurality of radiation sources positioned proximate to the first support member to direct radiation in a plurality of generally parallel radiation paths across the workpiece location in a direction generally parallel to a plane of the workpiece location; and
a plurality of radiation sensors corresponding to the plurality of radiation sources, wherein the radiation sensors are positioned at least proximate to the first support member and the radiation source, the radiation sensors being configured to receive at least a portion of the radiation directed by the radiation sources and passing across the workpiece location.

25. The apparatus of claim 24 wherein individual radiation sensors are positioned to detect at least one of (a) radiation from the radiation sources, and (b) an absence of radiation from the radiation sources due to a structure between the radiation source and the radiation sensor.

26. The apparatus of claim 24 wherein the first support member is positioned to carry the microfeature workpiece in a generally horizontal orientation.

27. The apparatus of claim 24 wherein individual radiation sensors includes multiple radiation sensor elements having different spacings from the workpiece location in a direction generally normal to the workpiece location.

28. The apparatus of claim 24 wherein individual radiation sensors are configured to detect gradations in radiation intensity.

29. The apparatus of claim 24 wherein individual radiation sources are positioned to direct radiation beams over strip-wise regions of a microfeature workpiece.

30. The apparatus of claim 24, further comprising a workpiece thickness detector positioned proximate to the first support member, the workpiece thickness detector being configured to:
    detect first location values corresponding to a plurality of points on a support surface of the first support member;
    detect second location values corresponding to a plurality of points on a surface of a microfeature workpiece carried by the first support member;
    determine an average location of the support surface based on the first location values; and
    determine an average thickness of a microfeature workpiece carried by the first support member based on a difference between the first and second location values.

31. The apparatus of claim 24 wherein individual radiation sources are positioned to direct radiation across a planar support surface of the first support member when the first support member does not carry a microfeature workpiece, and wherein the radiation sources are positioned to direct radiation across a planar surface of a microfeature workpiece when the first support member does carry the microfeature workpiece.

32. An apparatus for testing microfeature workpieces, comprising:
    a first support member configured to releasably carry a microfeature workpiece;
    a second support member positioned proximate to the first support member, the second support member being configured to carry an electrical testing device, at least one of the first and second support members being movable toward and away from the other;
    detection means for detecting variations in a profile of a microfeature workpiece carried by the first support member, the detection means being configured to detect variations in the profile over at least approximately an entire testing area of the microfeature workpiece; and
    a workpiece thickness detector positioned proximate to the first support member, the workpiece thickness detector being configured to:
        detect first location values corresponding to a plurality of points on a support surface of the support member;
        detect second location values corresponding to a plurality of points on a surface of a microfeature workpiece carried by the support member;
        determine an average location of a workpiece location plane based on the first location values; and
        determine an average thickness of a microfeature workpiece carried by the support member based on a difference between the first and second location values.

33. The apparatus of claim 32 wherein the detection means is configured to detect variations in the profile over multiple regions of the microfeature workpiece in a sequential manner.

34. The apparatus of claim 32 wherein the detection means includes a radiation source spaced apart from a radiation sensor, and wherein at least part of the first support member is positioned between the radiation source and the radiation sensor.

35. The apparatus of claim 32 wherein the detection means is configured to detect variations in the profiles of a plurality of generally strip-shaped regions of the microfeature workpiece.

36. The apparatus of claim 32 wherein the first support member is configured to carry a microfeature workpiece at a workpiece location, and wherein the first support member is movable relative to the detection means in a direction generally parallel to a plane of the workpiece location.

37. The apparatus of claim 32 wherein the detection means is configured to detect variations in a profile generally normal to a major surface of the microfeature workpiece.

38. A method for assessing a microfeature workpiece, comprising:
    carrying a microfeature workpiece with a support surface so that the microfeature workpiece is proximate to an electrical testing device;
    determining if a profile of at least one of the support surface and a surface of the microfeature workpiece exceed a threshold value, wherein determining if the profile of the support surface exceeds the threshold value includes directing radiation across the support surface in a direction generally parallel to the support surface and sensing the radiation after the radiation has passed over the support surface; and
    engaging the electrical testing device with the microfeature workpiece if the threshold value is not exceeded.

39. The method of claim 38, further comprising providing a signal if a profile of at least one of the support surface and a surface of the microfeature workpiece exceed a threshold value.

40. The method of claim 38 wherein determining includes:
    determining an average location of the surface of the microfeature workpiece;
    determining local profile information at a plurality of regions of the microfeature workpiece by:
        directing radiation across the microfeature workpiece in a direction generally parallel to the support surface; and
        sensing the radiation after the radiation has passed over the microfeature workpiece; and
    comparing the local profile information at the plurality of regions with the average location of the surface.

41. The method of claim 38 wherein determining includes determining if a profile of the support surface exceeds a threshold value by:
    directing radiation across the support surface in a direction generally parallel to the support surface; and
    sensing at least a partial blockage of the radiation passing over the support surface, due to an obstruction extending from the support surface.

42. The method of claim 38 wherein determining includes determining if a profile of the microfeature workpiece exceeds a threshold value by:
    directing radiation across the microfeature workpiece in a direction generally parallel to the support surface; and sensing the radiation after the radiation has passed over the microfeature workpiece.

43. The method of claim 38 wherein determining includes determining if a profile of the microfeature workpiece exceeds a threshold value by:
directing radiation across the microfeature workpiece in a direction generally parallel to the support surface; and
sensing at least a partial blockage of the radiation passing over the microfeature workpiece, due to an obstruction extending from the microfeature workpiece.

44. A method for assessing a microfeature workpiece, comprising:
carrying a microfeature workpiece with a support surface so that the microfeature workpiece is proximate to an electrical testing device;
determining if a profile of at least one of the support surface and a surface of the microfeature workpiece exceed a threshold value,
engaging the electrical testing device with the microfeature workpiece if the threshold value is not exceeded;
determining an average location of the support surface by averaging data taken at several locations of the support surface;
determining an average location of the surface of the microfeature workpiece by averaging data taken at several locations of the surface of the microfeature workpiece; and wherein
determining if a profile of at least one of the support surface and a surface of the microfeature workpiece exceed a threshold value includes determining if a profile of the support surface exceeds a threshold deviation from the average location by:
directing radiation across the support surface in a direction generally parallel to the support surface; and
sensing the radiation after the radiation has passed over the support surface; and wherein the method further comprises:
determining if a profile of the microfeature workpiece exceeds a threshold value by:
directing radiation across the microfeature workpiece in a direction generally parallel to the support surface; and
sensing the radiation after the radiation has passed over the microfeature workpiece.

45. A method for assessing a microfeature workpiece, comprising:
directing radiation generally parallel to a surface of a unitary microfeature workpiece having a plurality of attached dies, or a support surface configured to support the microfeature workpiece, or both;
detecting at least a portion of the radiation after the radiation has traversed the surface of the microfeature workpiece, or the support surface, or both;
based at least in part on (a) the detected radiation, or (b) an absence of detected radiation, or (c) both (a) and (b), determining if a profile of at least one of the support surface and the surface of the microfeature workpiece exceed a threshold value; and
engaging an electrical testing device with the microfeature workpiece if the threshold value is not exceeded.

46. The method of claim 45, further comprising interrupting an assessment process of the microfeature workpiece if the threshold value is exceeded.

47. The method of claim 45, further comprising:
interrupting an assessment process of the microfeature workpiece if the threshold value for the support surface is exceeded; and
removing material from the support surface before continuing the assessment process.

48. The method of claim 45, further comprising:
interrupting an assessment process of the microfeature workpiece if the threshold value for the surface of the microfeature workpiece is exceeded; and
removing material from at least one of the support surface and the surface of the microfeature workpiece before continuing the assessment process.

49. A computer-readable medium having contents for performing a method for assessing a microfeature workpiece, the method comprising:
determining if a profile of at least one of a surface of a microfeature workpiece and a surface of a support member carrying the microfeature workpiece exceed a threshold value, wherein determining if a profile of the support surface exceeds a threshold value includes directing radiation across the support surface in a direction generally parallel to the support surface and sensing the radiation after the radiation has passed over the support surface; and
directing engagement between an electrical testing device and the microfeature workpiece if the threshold value is not exceeded.

50. The computer-readable medium of claim 49 wherein the method further comprises interrupting an assessment process of the microfeature workpiece if the threshold value for the support surface is exceeded.

51. The computer-readable medium of claim 49 wherein the method further comprises interrupting an assessment process of the microfeature workpiece if the threshold value for the microfeature workpiece is exceeded.

52. The computer-readable medium of claim 49 wherein determining includes determining if a profile of the microfeature workpiece exceeds a threshold value by:
directing radiation across the microfeature workpiece in a direction generally parallel to the support surface; and
sensing the radiation after the radiation has passed over the microfeature workpiece.

53. The computer-readable medium of claim 49 wherein the method further comprises:
determining an average location of the support surface by averaging data taken at several locations of the support surface;
determining an average location of the surface of the microfeature workpiece by averaging data taken at several locations of the surface of the microfeature workpiece; and wherein
determining if a profile of at least one of the support surface and a surface of the microfeature workpiece exceed a threshold value includes
determining if a profile of the microfeature workpiece exceeds a threshold value by:
directing radiation across the microfeature workpiece in a direction generally parallel to the support surface; and
sensing the radiation after the radiation has passed over the microfeature workpiece.

54. The computer-readable medium of claim 49 wherein the method further comprises providing a signal if a profile of at least one of the support surface and a surface of the microfeature workpiece exceed a threshold value.

* * * * *